United States Patent
Zhou et al.

(10) Patent No.: US 6,750,136 B2
(45) Date of Patent: Jun. 15, 2004

(54) CONTACT STRUCTURE PRODUCTION METHOD

(75) Inventors: Yu Zhou, Vernon Hills, IL (US); David Yu, Bloomingdale, IL (US); Robert Edward Aldaz, Carol Stream, IL (US); Theodore A. Khoury, Evanston, IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/412,009

(22) Filed: Apr. 11, 2003

(65) Prior Publication Data

US 2003/0173661 A1 Sep. 18, 2003

Related U.S. Application Data

(63) Continuation of application No. 09/954,333, filed on Sep. 12, 2001, now Pat. No. 6,608,385, and a continuation-in-part of application No. 09/733,508, filed on Dec. 9, 2000, now Pat. No. 6,471,538, and a continuation-in-part of application No. 09/503,903, filed on Feb. 14, 2000, now Pat. No. 6,540,524, which is a continuation-in-part of application No. 09/201,299, filed on Nov. 30, 1998, now Pat. No. 6,297,164.

(51) Int. Cl.[7] ............................................. H01L 21/44
(52) U.S. Cl. ........................ 438/617; 438/619; 438/117
(58) Field of Search .................. 438/614, 612, 438/617, 619, 629, 117, 110; 257/775, 781, 784

(56) References Cited

U.S. PATENT DOCUMENTS

| | | | | |
|---|---|---|---|---|
| 6,023,103 A | * | 2/2000 | Chang et al. | 257/781 |
| 6,420,255 B1 | * | 7/2002 | Takahashi | 438/613 |
| 6,437,453 B1 | * | 8/2002 | Koyama et al. | 257/784 |
| 6,486,551 B1 | * | 11/2002 | Sato et al. | 257/737 |
| 6,489,182 B2 | * | 12/2002 | Kwon | 438/110 |
| 6,653,170 B1 | * | 11/2003 | Lin | 438/117 |
| 6,656,829 B2 | * | 12/2003 | Miyamoto | 438/613 |

* cited by examiner

Primary Examiner—Wael Fahmy
Assistant Examiner—Hoa B. Trinh
(74) Attorney, Agent, or Firm—Muramatsu & Associates

(57) ABSTRACT

A method of producing a contact structure for establishing electrical connection with contact targets. The contact structure is formed of a contactor carrier and a plurality of contactors. The contactor has an upper end oriented in a vertical direction, a straight beam portion oriented in a direction opposite to the upper end and having a lower end which functions as a contact point for electrical connection with a contact target, a return portion returned from the lower end and running in parallel with the straight beam portion to create a predetermined gap therebetween, a diagonal beam portion provided between the upper end and the straight beam portion to function as a spring.

15 Claims, 17 Drawing Sheets

Fig.3
(Prior Art)
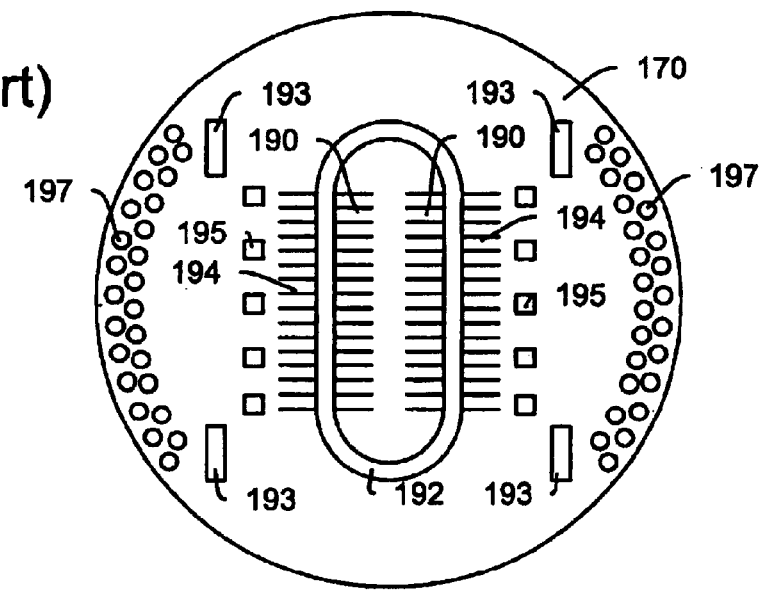
Fig. 4A
(Prior Art)
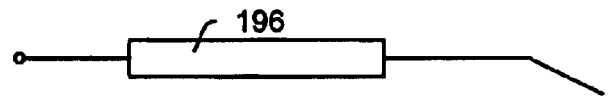
Fig. 4B
(Prior Art)
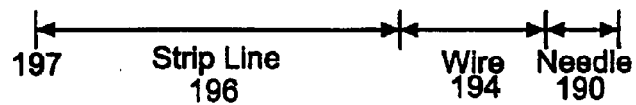
Fig. 4C
(Prior Art)
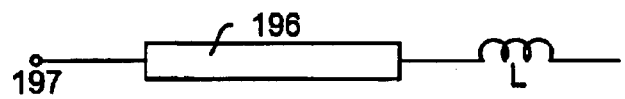
Fig. 4D
(Prior Art)
Fig. 4E
(Prior Art)
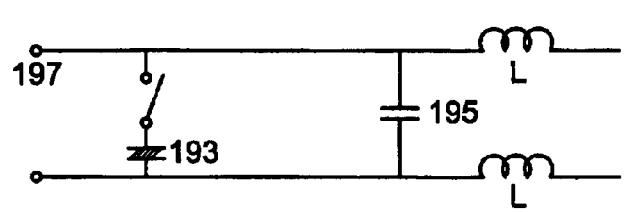

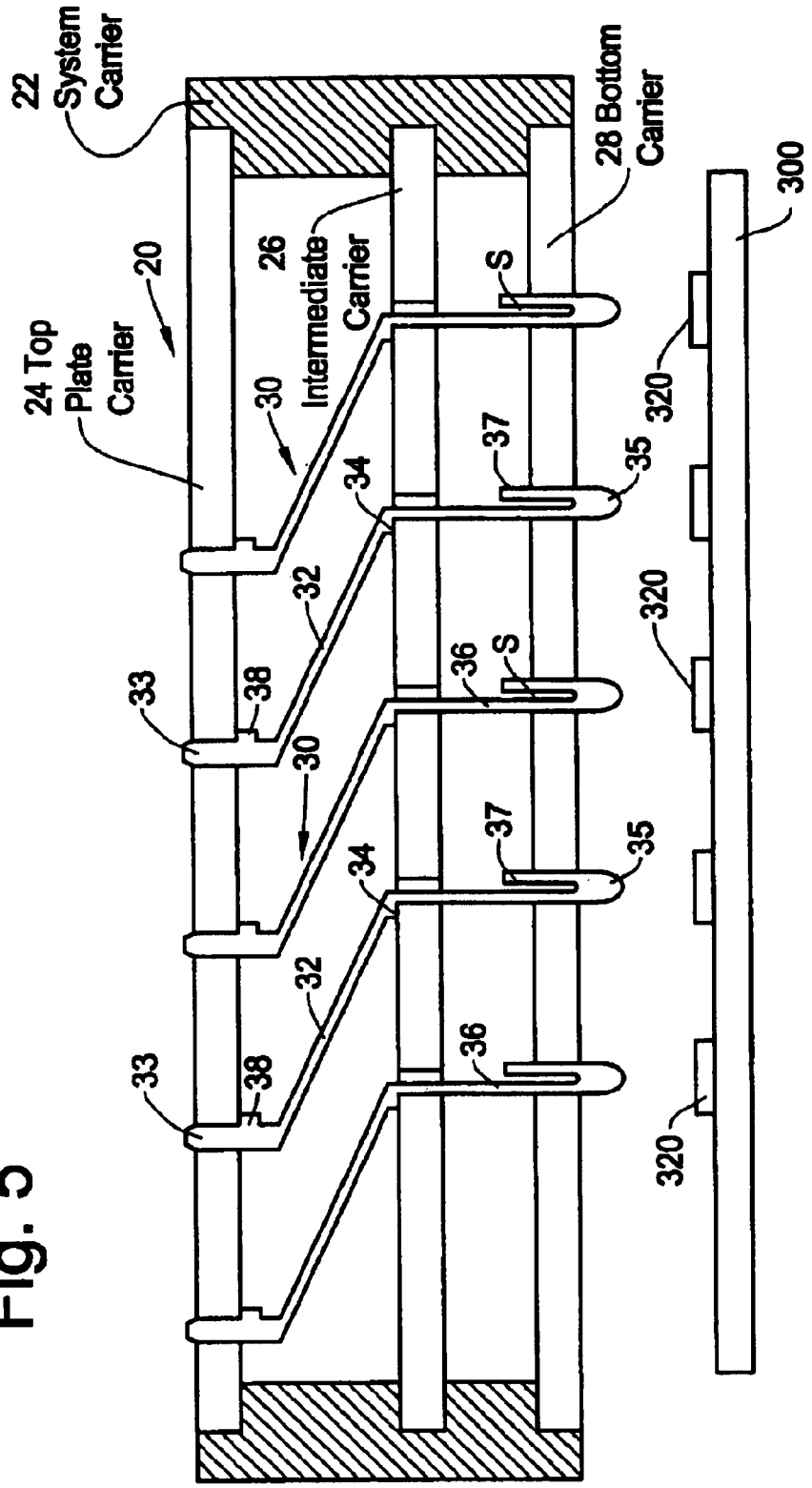

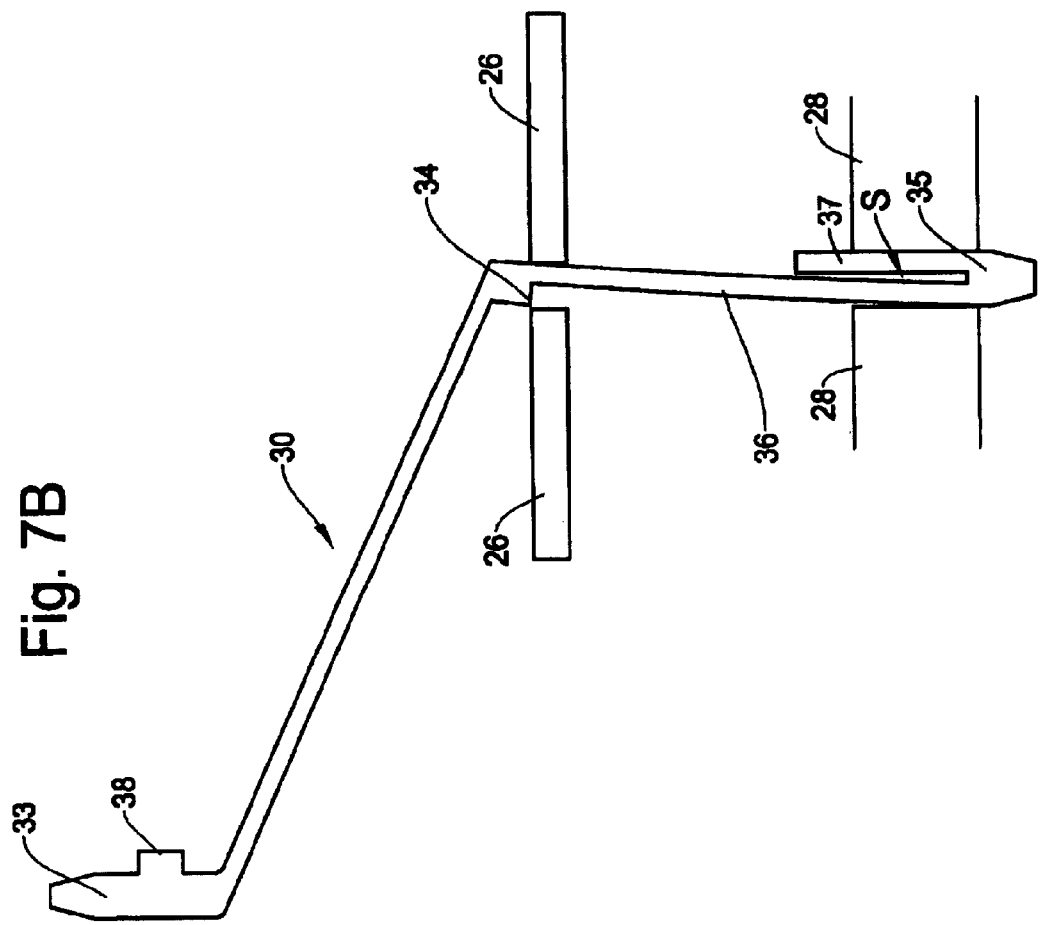

CONTACT STRUCTURE PRODUCTION METHOD

This is a continuation of U.S. patent application Ser. No. 09/954,333 filed Sep. 12, 2001 now U.S. Pat. No. 6,608,385 which is a continuation-in-part of patent application Ser. No. 09/201,299 filed Nov. 30, 1998, now U.S. Pat. No. 6,297,164, and a continuation-in-part of patent application Ser. No. 09/503,903 filed Feb. 14, 2000, now U.S. Pat. No. 6,540,524, and a continuation-in-part of patent application Ser. No. 09/733,508 filed Dec. 9, 2000, now U.S. Pat. No. 6,471,538.

FIELD OF THE INVENTION

This invention relates to a contact structure and a production method thereof and a probe contact assembly using the contact structure, and more particularly, to a contact structure having a large number of contactors in a vertical direction and to a method for producing such a large number of contactors on a semiconductor wafer in a horizontal direction and removing the contactors from the wafer to be mounted on a substrate in a vertical direction to form the contact structure such as a contact probe assembly, probe card, IC chip, or other contact mechanism.

BACKGROUND OF THE INVENTION

In testing high density and high speed electrical devices such as LSI and VLSI circuits, a high performance contact structure such as a probe card having a large number of contactors must be used. In other applications, contact structures may be used for IC packages as IC leads.

The present invention is directed to a structure and production process of such contact structures for use in testing and burning-in LSI and VLSI chips, semiconductor wafers and dice, packaged semiconductor devices, printed circuit boards and the like. The present invention can also be applicable to other purposes such as forming leads or terminal pins of IC chips, IC packages or other electronic devices. However, for the simplicity and convenience of explanation, the present invention is described mainly with respect to the semiconductor wafer testing.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system with a bundle of cables 110. The test head 100 and a substrate handler 400 are mechanically as well as electrically connected with one another with the aid of a manipulator 500 which is driven by a motor 510. The semiconductor wafers to be tested are automatically provided to a test position of the test head 100 by the substrate handler 400.

On the test head 100, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals from the wafer are compared with expected data to determine whether the IC circuits on the semiconductor wafer function correctly.

Referring to FIGS. 1 and 2, the test head 100 and the substrate handler 400 are connected through an interface component 140 consisting of a performance board 120 which is a printed circuit board having electric circuit connections unique to a test head's electrical footprint, coaxial cables, pogo-pins and connectors. The test head 100 includes a large number of printed circuit boards 150 which correspond to the number of test channels (test pins) of the semiconductor test system. Each of the printed circuit boards 150 has a connector 160 to receive a corresponding contact terminal 121 of the performance board 120.

A "frog" ring 130 is mounted on the performance board 120 to accurately determine the contact position relative to the substrate handler 400. The frog ring 130 has a large number of contact pins 141, such as ZIF connectors or pogo-pins, connected to contact terminals 121, through coaxial cables 124.

As shown in FIG. 2, the test head 100 is positioned over the substrate handler 400 and connected to the substrate handler through the interface component 140. In the substrate handler 400, a semiconductor wafer 300 to be tested is mounted on a chuck 180. In this example, a probe card 170 is provided above the semiconductor wafer 300 to be tested. The probe card 170 has a large number of probe contactors (such as cantilevers or needles) 190 to contact with contact targets such as circuit terminals or pads in the IC circuit on the semiconductor wafer 300 under test.

Electrodes (contact pads) of the probe card 170 are electrically connected to the contact pins 141 provided on the frog ring 130. The contact pins 141 are also connected to the contact terminals 121 of the performance board 120 through the coaxial cables 124 where each contact terminal 121 is connected to the corresponding printed circuit board 150 of the test head 100. Further, the printed circuit boards 150 are connected to the semiconductor test system through the cable 110 having, for example, several hundreds of inner cables.

Under this arrangement, the probe contactors (needles) 190 contact the surface (contact target) of the semiconductor wafer 300 on the chuck 180 to apply test signals to the semiconductor wafer 300 and receive the resultant output signals from the wafer 300. As noted above, the resultant output signals from the semiconductor wafer 300 under test are compared with the expected data generated by the semiconductor test system to determine whether the IC circuits on the semiconductor wafer 300 performs properly.

FIG. 3 is a bottom view of the probe card 170 of FIG. 2. In this example, the probe card 170 has an epoxy ring on which a plurality of probe contactors 190 called needles or cantilevers are mounted. When the chuck 180 mounting the semiconductor wafer 300 moves upward in FIG. 2, the tips of the needles 190 contact the pads or bumps (contact targets) on the wafer 300. The ends of the needles 190 are connected to wires 194 which are further connected to transmission lines (not shown) formed on the probe card 170. The transmission lines are connected to a plurality of electrodes (contact pads) 197 which are in communication with the pogo pins 141 of FIG. 2.

Typically, the probe card 170 is structured by a multi-layer of polyimide substrates having ground planes, power planes, signal transmission lines on many layers. As is well known in the art, each of the signal transmission lines is designed to have a characteristic impedance such as 50 ohms by balancing the distributed parameters, i.e., dielectric constant and magnetic permeability of the polyimide, inductances and capacitances of the signal paths within the probe card 170. Thus, the signal lines are impedance matched establishing a high frequency transmission bandwidth to the wafer 300 for supplying currents in a steady state as well as high current peaks generated by the device's outputs switching in a transient state. For removing noise, capacitors 193 and 195 are provided on the probe card between the power and ground planes.

An equivalent circuit of the probe card 170 is shown in FIG. 4. As shown in FIGS. 4A and 4B, the signal transmission line on the probe card 170 extends from the electrode 197, the strip (impedance matched) line 196, the wire 194, to the needle 190. Since the wire 194 and needle 190 are not impedance matched, these portions are deemed as an inductor L in the high frequency band as shown in FIG. 4C. Because of the overall length of the wire 194 and needle 190 is around 20–30 mm, significant limitations will be resulted from the inductor when testing a high frequency performance of a device under test.

Other factors which limit the frequency bandwidth in the probe card 170 reside in the power and ground contactors shown in FIGS. 4D and 4E. If the power line can provide large enough currents to the device under test, it will not seriously limit the operational bandwidth in testing the device. However, because the series connected wire 194 and needle 190 for supplying the power (FIG. 4D) as well as the series connected wire 194 and needle 190 for grounding the power and signals (FIG. 4E) are equivalent to inductors, the high speed current flow is seriously restricted.

Moreover, the capacitors 193 and 195 are provided between the power line and the ground line to secure a proper performance of the device under test by filtering out the noise or surge pulses on the power lines. The capacitors 193 have a relatively large value such as 10 $\mu$F and can be disconnected from the power lines by switches if necessary. The capacitors 195 have a relatively small capacitance value such as 0.01 $\mu$F and fixedly connected close to the DUT. These capacitors serve the function as high frequency decoupling on the power lines. In other words, the capacitors limit the high frequency performance of the probe contactor.

Accordingly, the most widely used probe contactors as noted above are limited to the frequency bandwidth of approximately 200 MHz which is insufficient to test recent semiconductor devices. In the industry, it is considered that the frequency bandwidth on the order of 1 GHz or higher, will be necessary in the near future. Further, it is desired in the industry that a probe card is capable of handling a large number of semiconductor devices, especially memories, such as 32 or more, in a parallel fashion to increase test throughput.

In the conventional technology, the probe card and probe contactors such as shown in FIG. 3 are manually made, resulting in inconsistent quality. Such inconsistent quality includes fluctuations of size, frequency bandwidth, contact forces and resistance, etc. In the conventional probe contactors, another factor making the contact performance unreliable is a temperature change under which the probe contactors and the semiconductor wafer under test have different temperature expansion ratios. Thus, under the varying temperature, the contact positions therebetween vary which adversely affects the contact force, contact resistance and bandwidth. Thus, there is a need of a contact structure with a new concept which can satisfy the requirement in the next generation semiconductor test technology.

SUMMARY OF THE INVENTION

Therefore, it is an object of the present invention to provide a contact structure having a large number of contactors for electrically contacting with contact targets with a high frequency bandwidth, high pin counts and high contact performance as well as high reliability.

It is another object of the present invention to provide a contact structure such as a probe card for use in testing semiconductor devices and the like which has a very high frequency bandwidth to meet the test requirements in the next generation semiconductor test technology.

It is a further object of the present invention to provide a contact structure to establish electrical connection with a large number of semiconductor devices for testing such semiconductor devices in parallel at the same time.

It is a further object of the present invention to provide a method for producing a large number of contactors in a two dimensional manner on a silicon substrate, removing the contactors from the substrate and mounting the contactors on a contact substrate in a three dimensional manner to form a contact structure.

It is a further object of the present invention to provide a method for producing a large number of contactors in a two dimensional manner on a silicon substrate, transferring the contactors to an adhesive tape and removing the contactors therefrom for vertically mounting the same on a contact substrate to form a contact structure.

In the present invention, a contact structure is formed of a large number of contactors produced on a planar surface of a dielectric substrate or a silicon substrate by a photolithography technology. The contact structure of the present invention is advantageously applied to testing and burning-in semiconductor devices, such as LSI and VLSI chips, semiconductor wafers and dice, packaged ICs, printed circuit boards and the like. The contact structure of the present invention can also be used as components of electronics devices such as IC leads and pins.

The first aspect of the present invention is a contact structure for establishing electrical connection with contact targets. The contact structure is formed of a contactor carrier and a plurality of contactors. The contactor has an upper end oriented in a vertical direction, a straight beam portion oriented in a direction opposite to the upper end and having a lower end which functions as a contact point for electrical connection with a contact target, a return portion returned from the lower end and running in parallel with the straight beam portion to create a predetermined gap therebetween, a diagonal beam portion provided between the upper end and the straight beam portion to function as a spring.

Another aspect of the present invention is a method of producing the contactors in a two dimensional manner on a silicon substrate and removing therefrom for establishing a contact structure. The production method is comprised of the following steps of:

(a) forming a sacrificial layer on a surface of a silicon substrate;

(b) forming a photoresist layer on the sacrificial layer;

(c) aligning a photo mask over the photoresist layer and exposing the photoresist layer with ultraviolet light through the photo mask, the photo mask including an image of the contactors;

(d) developing patterns of the image of the contactors on a surface of the photoresist layer;

(e) forming the contactors made of conductive material in the patterns on the photoresist layer by depositing the conductive material; each of the contactors having an upper end, a straight beam portion oriented with a lower end as a contact point, a return portion to create a predetermined gap with the straight beam portion, and a diagonal beam portion provided between the upper end and the straight beam portion to function as a spring;

(f) stripping the photoresist layer off;

(g) removing the sacrificial layer by an etching process so that the contactors are separated from the silicon substrate; and (h) mounting the contactors on a contactor carrier having through holes to receive the contactors therein.

A further aspect of the second present invention is a probe contact assembly including the contact structure of the present invention. The probe contact assembly is formed of a contactor carrier having a plurality of contactors mounted on a surface thereof, a probe card for mounting the contactor carrier and establishing electrical communication between the contactors and electrodes provided on the probe card, and a pin block having a plurality of contact pins to interface between the probe card and a semiconductor test system when the pin block is attached to the probe card. Each contactor has a structure as described above with respect to the first aspect of the present invention.

According to the present invention, the contact structure has a very high frequency bandwidth to meet the test requirements of next generation semiconductor technology. Since the large number of contactors are produced at the same time on the substrate without involving manual handling, it is possible to achieve consistent quality, high reliability and long life in the contact performance as well as low cost. Further, because the contactors are assembled on the same substrate material as that of the device under test, it is possible to compensate positional errors caused by temperature changes.

Further, according to the present invention, the production process is able to produce a large number of contactors in a horizontal direction on the silicon substrate by using relatively simple technique. Such contactors are removed from the substrate and mounted on a contact substrate in a vertical direction. The contact structure produced by the present invention are low cost and high efficiency and have high mechanical strength and reliability.

BRIEF DESCRIPTION OF THE DRAWINGS

FIG. 3 is a bottom view showing an example of the probe card having an epoxy ring for mounting a plurality of probe contactors in the conventional technology.

FIGS. 4A–4E are circuit diagrams showing equivalent circuits of the probe card of FIG. 3.

FIG. 5 is a schematic diagram showing an example of contact structure of the present invention using contactors produced in a horizontal direction on a substrate and vertically mounted on a contactor carrier.

FIGS. 7A and 7B are diagrams showing details of the contactor of the present invention wherein FIG. 7A is a front view of the contactor when no pressure is applied thereto and FIG. 7B is a front view of the contactor when it is pressed against the contact target.

DETAILED DESCRIPTION OF THE INVENTION

Figure 1:
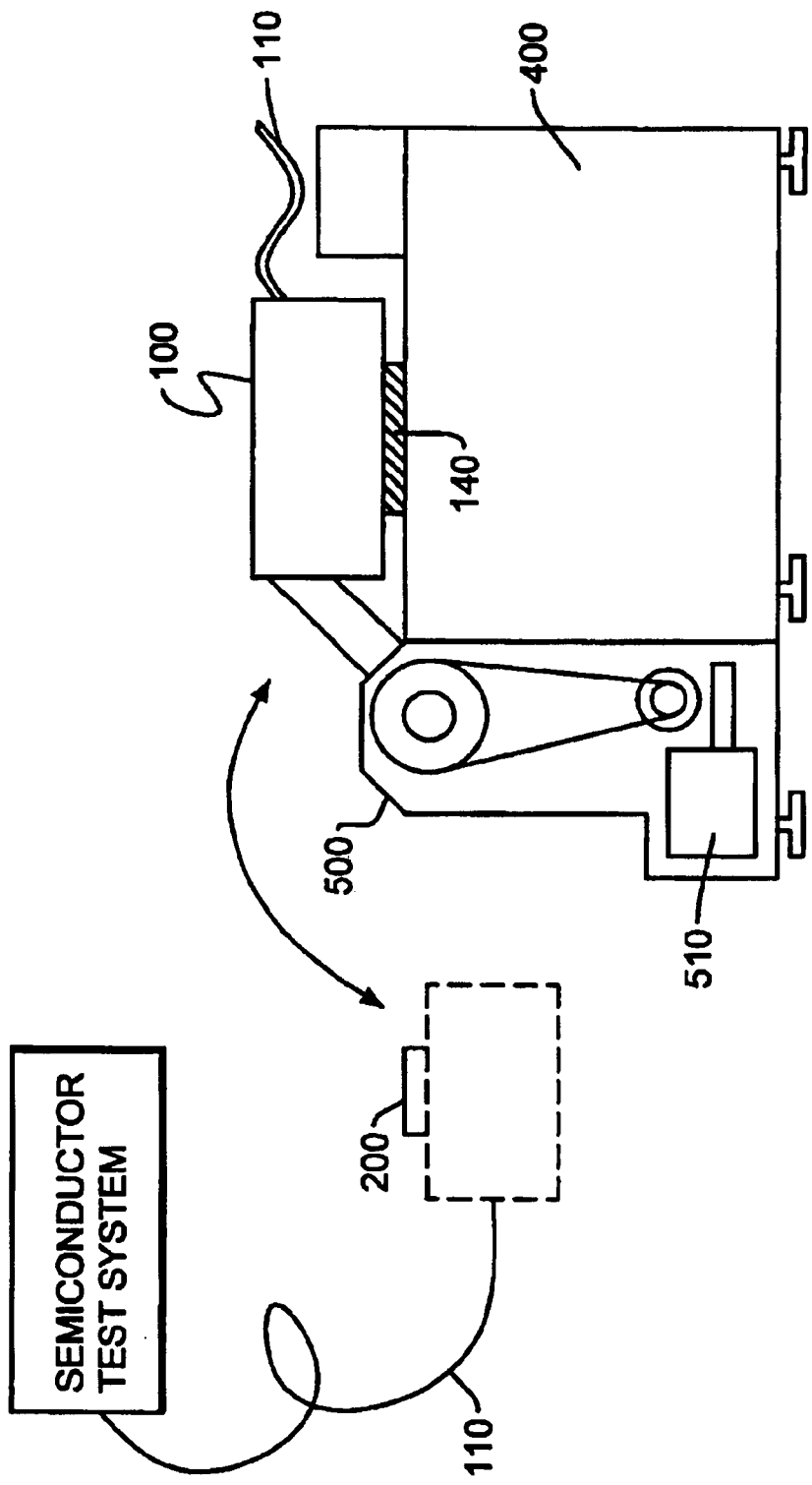
FIG. 1 is a schematic diagram showing a structural relationship between a substrate handler and a semiconductor test system having a test head.

The present invention will now be explained in detail with reference to FIGS. 5–13. It should be noted that the description of the present invention includes such terms as "horizontal" and "vertical". The inventors use these terms to describe relative positional relationship of the components associated with the present invention. Therefore, the interpretation of the terms "horizontal" and "vertical" should not be limited to absolute meanings such as an earth horizontal or gravity vertical.

FIG. 5 shows an example of contact structure of the present invention. The contact structure is configured by a contactor carrier 20 and contactors 30. In an application of semiconductor test, the contact structure is positioned, for example, over a semiconductor device such as a silicon wafer 300 to be tested. When the silicon wafer 300 is moved upward, the lower ends of the contactors 30 contact with contact pads 320 on the semiconductor wafer 300 to establish electrical communication therebetween.

In this example, the contactor carrier 20 is comprised of a system carrier 22, a top plate carrier 24, an intermediate plate carrier 26, and a bottom plate carrier 28. The contactor carrier 20 is made of silicon or dielectric material such as polyimide, ceramic or glass. The system carrier 22 supports the top, intermediate, and bottom plate carriers with predetermined space therebetween. The top plate carrier 24, the intermediate plate carrier 26 and the bottom plate carrier 28 respectively have through holes for mounting the contactors 30.

In FIG. 5, each contactor 30 has a cantilever like shape as a whole which is composed of an upper end (base portion) 33, a diagonal beam (spring) portion 32, a straight beam portion 36, a lower end (contact portion) 35 and a return portion 37. Preferably, stoppers 34 and 38 are provided to each contactor 30 to securely mount the contactor 30 on the contactor carrier 20. Namely, the stopper 38 limits the upward movement of the contactor 30 by engaging with the upper plate carrier 24 and the stopper 34 limits the downward movement of the contactor 30 by engaging with the intermediate plate carrier 26.

The diagonal beam portion 32 diagonally extends between the upper end 33 and the straight beam portion 36. The straight beam portion 36 extends downwardly between the diagonal beam portion 32 and the lower end 35. The upper end 33 and the lower end 35 function as contact points to establish electrical communication with other components. In the semiconductor test application, the upper end 33 functions to contact with a probe card of the test system and the lower end 35 functions to contact with a contact target such as the contact pad 320 on the semiconductor wafer 300.

The return portion 37 runs upwardly from the lower end 35 in parallel with the straight beam portion 36. In other words, the return portion 37 and the straight beam portion 36 constitute a space (gap) S therebetween at about a position inserted in the through hole of the bottom plate carrier 28. This structure ensures a sufficient width with respect to the through holes on the bottom plate carrier 28 and allows flexibility when deforming the contactor 30. This is effective when the contactor is pressed against the contact target, which will be further explained later with reference to FIGS. 7A and 7B.

The contactors 30 are mounted on the contactor carrier 20 via the through holes provided therein. In this example, the top plate carrier 24, the intermediate plate carrier 26 and the bottom plate carrier 28 respectively include through holes to receive the contactors 30 therein. The upper end 33 is projected from the upper surface of the top plate carrier 24 and the lower end 35 is projected from the lower surface of the bottom plate carrier 28. The middle portion of the contactor 30 may be loosely coupled to the intermediate plate carrier 26 so that the contactor 30 is movable when the contact structure is pressed against a contact target, such as the contact pad 320 on the semiconductor wafer 300.

The diagonal beam (spring) portion 32 of the contactor 30 functions as a spring to produce a resilient force when the upper end 33 contact the probe card and the lower end 35 is pressed against the contact target. The lower end (contact point) 35 of the contactor 30 is preferably sharpened to be able to scrub the surface of the contact pad 320. The resilient force promotes such a scrubbing effect at the lower end 35 against the surface of contact pad 320. The scrubbing effect promotes an improved contact performance when the contact point scrubs the metal oxide surface layer of the contact pad 320 to electrically contact the conductive material of the contact pad 320 under the metal oxide surface layer.

Figure 6A:
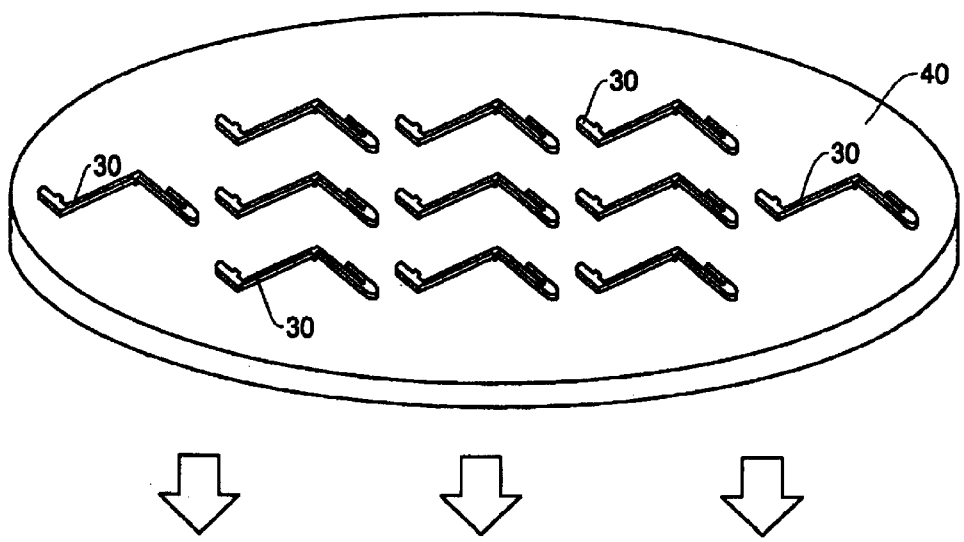
FIGS. 6A and 6B are schematic diagrams showing a basic concept of production method of the present invention in which a large number of contactors are formed on a planar surface of a substrate and removed therefrom for later processes.
Figure 6B:
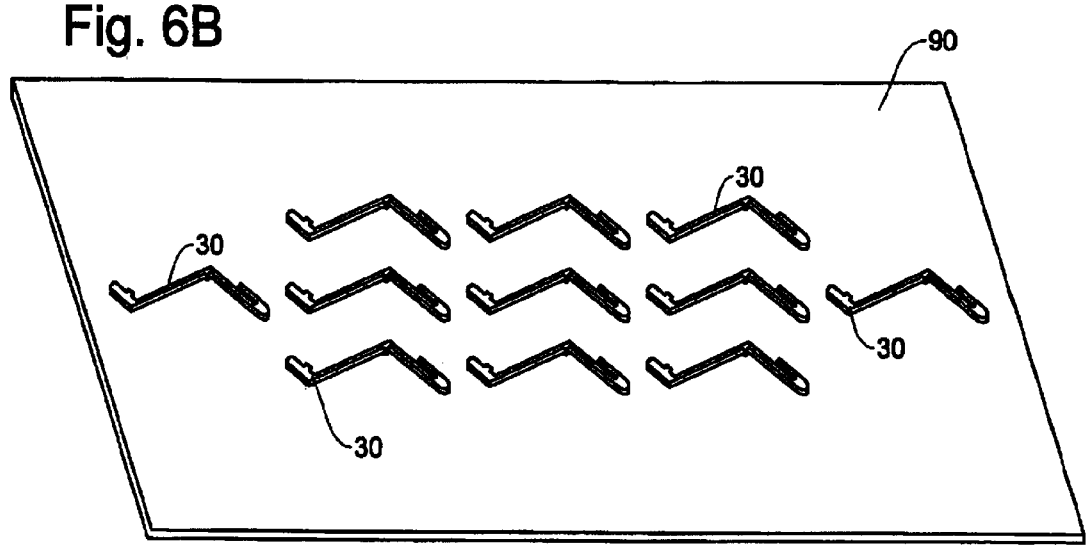

FIGS. 6A–6B show basic concepts of the present invention for producing such contactors. In the present invention, as shown in FIG. 6A, the contactors 30 are produced on a planar surface of a substrate 40 in a horizontal direction, i.e., in parallel with a planar surface of the substrate 40. In other words, the contactors 30 are built in a two dimensional manner on the substrate 40. Then, the contactors 30 are removed from the substrate 40 to be mounted on the contactor carrier 20 shown in FIG. 5 in a vertical direction, i.e., in a three dimensional manner. Typically, the substrate 40 is a silicon substrate although other dielectric substrates are also feasible.

In the example of FIGS. 6A and 6B, as noted above, the contactors 30 are produced on the planar surface of the substrate 40 in the horizontal direction. Then, in FIG. 6B, the contactors 30 are transferred from the substrate 40 to an adhesive member 90, such as an adhesive tape, adhesive film or adhesive plate (collectively "adhesive tape"). In the further process, the contactors 30 on the adhesive tape 90 are removed therefrom to be mounted on the contactor carrier 20 of FIG. 5 in a vertical direction, i.e., in a three dimensional manner with use, for example, of a pick and place mechanism.

Figure 7A:
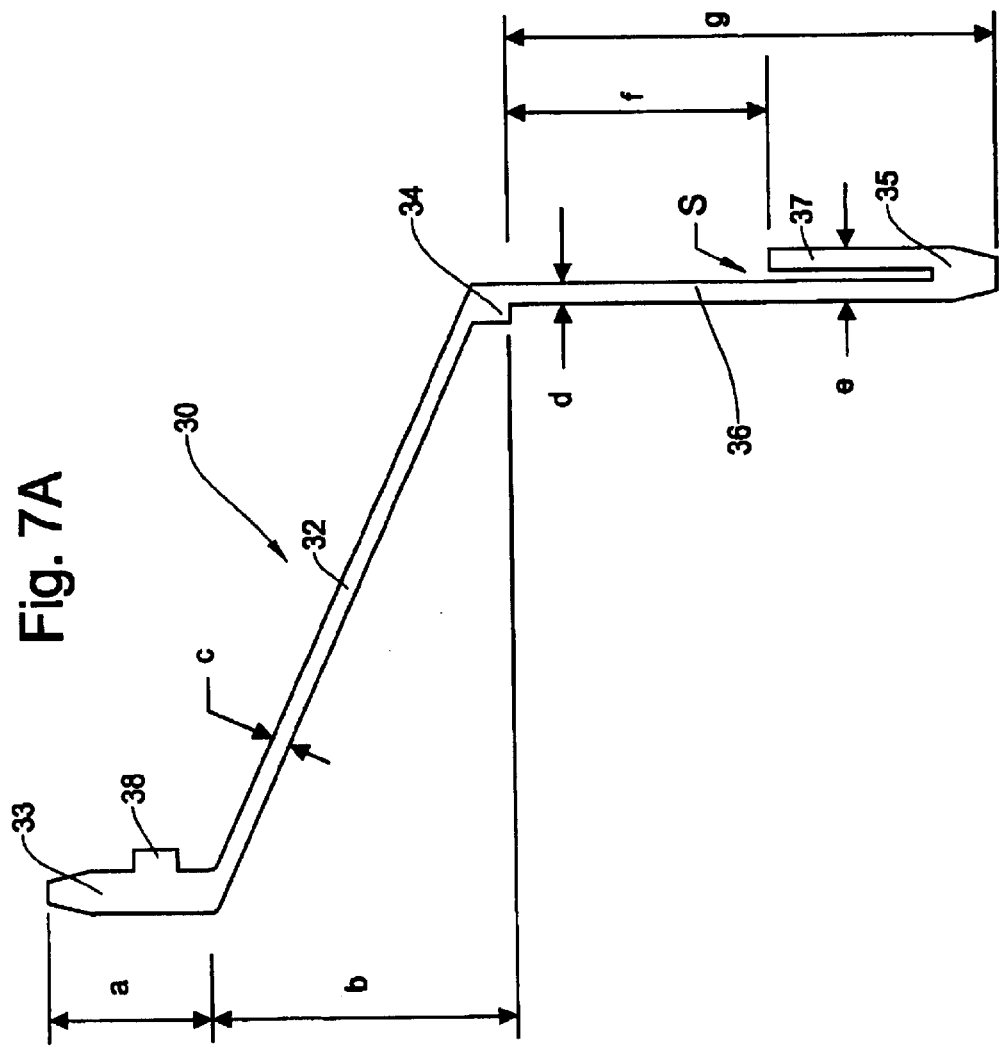

FIGS. 7A and 7B show more details of the contactor 30 of the present invention. FIG. 7A is a front view of the contactor 30 when no pressure is provided thereto, and FIG. 7B is a front view of the contactor 30 when the pressure is applied to the contact structure by being pressed against the contact target. FIG. 7A also shows an example of dimensions at each portion of the contactor 30. As noted above with reference to FIG. 5, the contactor 30 of FIGS. 7A and 7B has the upper end (base portion) 33, the diagonal beam (spring) portion 32, the straight beam portion 36, the lower end (contact portion) 35 and the return portion 37. The stopper 38 is provided to the upper end 33 and the stopper 34 is provided to the intermediate portion of the contactor 30.

Figure 12:
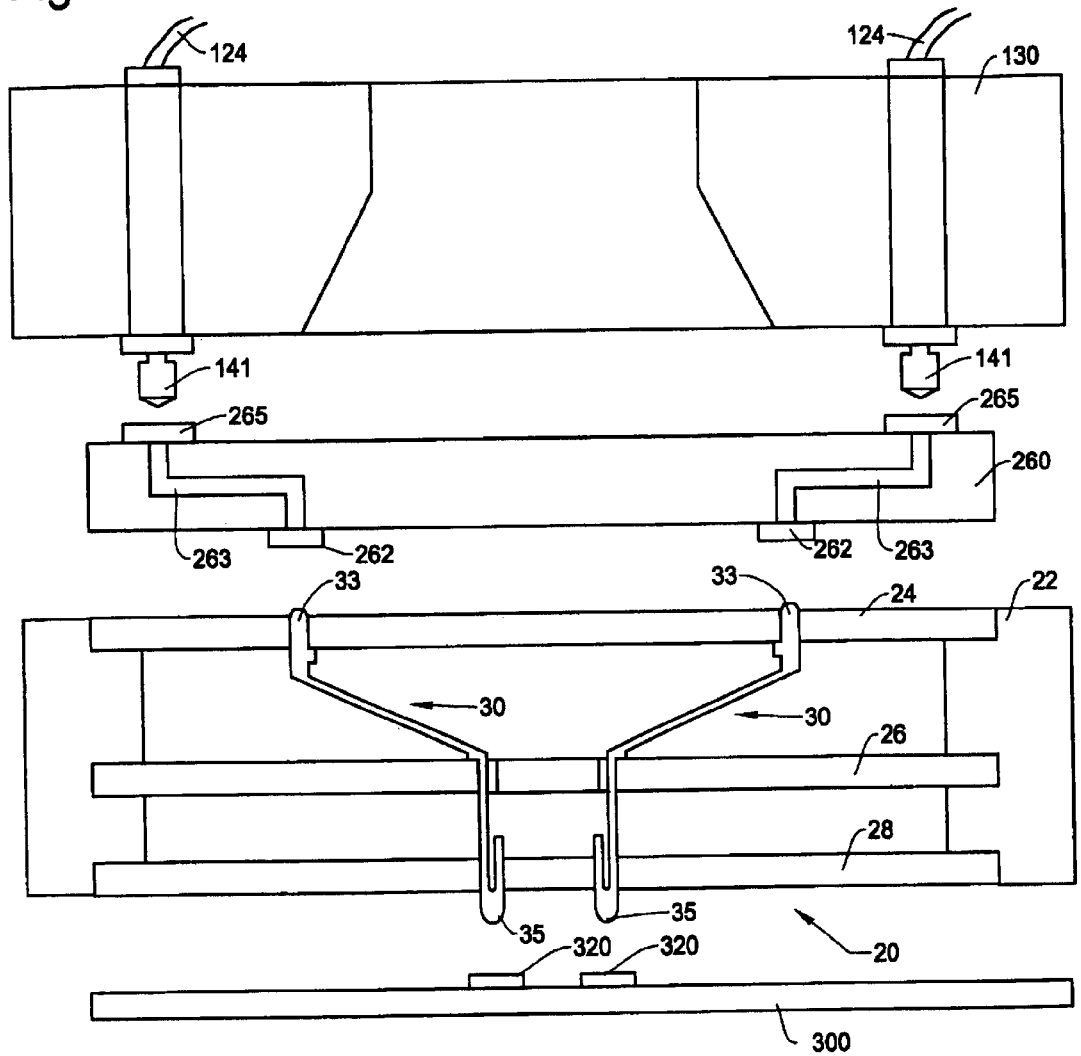
FIG. 12 is a cross sectional view showing an example of probe contact assembly using the contact structure of the present invention for use between a semiconductor device under test and a test head of a semiconductor test system.

In the semiconductor test application, the upper end 33 contacts with a probe card of the test system such as shown in FIG. 12 and the lower end 35 contacts with the contact target such as a semiconductor wafer under test. When mounted on the contactor carrier 20 of FIG. 5, the upper end 33 is projected from the upper surface of top plate carrier 24 of the contactor carrier 20 and the lower end 35 is projected from the lower surface of bottom plate carrier 28 of the contactor carrier 20.

In the front view of FIG. 7A, the diagonal beam portion 32 and the straight beam portion 36 preferably have a width which is smaller than that of the upper end 33 or the lower end 35 to promote the spring actions. The space (gap) S between the return portion 37 and the straight beam portion 36 further promotes the spring actions as shown in FIG. 7B. Namely, the space S allows the horizontal movements of the straight beam portion 36 and the diagonal beam portion 32 in the manner shown in FIG. 7B. Because of the reduced width of the beams portions 32 and 36 and the space S formed at the lower end 35, the diagonal beam portion 32 and the straight beam portion 36 easily deform when the contactor 30 is pressed between the probe card and the contact target. An example of sizes in the contactor 30 of FIG. 7 is: a=400 $\mu$m, b=1100 $\mu$m, c=50 $\mu$m, d=50 $\mu$m, e=140 $\mu$m, f=900 $\mu$m, and g=1600 $\mu$m.

Figure 8A:
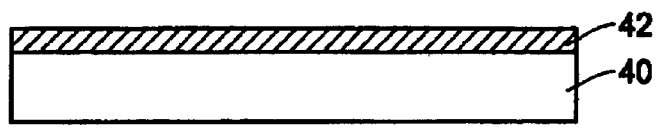
FIGS. 8A–8L are schematic diagrams showing an example of production process in the present invention for producing the contactors of the present invention.

FIGS. 8A–8L are schematic diagrams showing an example of production process for producing the contactor 30 of the present invention. In FIG. 8A, a sacrificial layer 42 is formed on a base substrate 40 which is typically a silicon substrate. Other dielectric substrate is also feasible such as a glass substrate and a ceramic substrate. The sacrificial layer 42 is made, for example, of silicon dioxide ($SiO_2$) through a deposition process such as a chemical vapor deposition (CVD). The sacrificial layer 42 is to separate contactors 30 from the silicon substrate in the later stage of the production process.

Figure 8B:
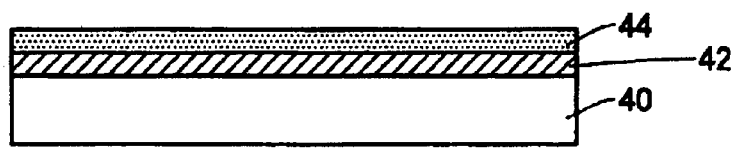
Figure 8C:
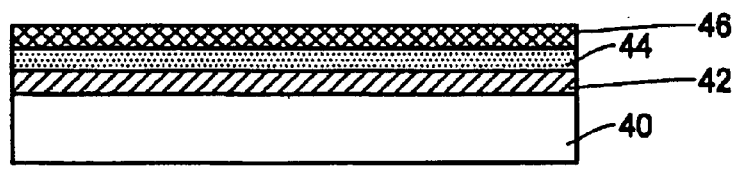

An adhesion promoter layer 44 is formed on the sacrificial layer 42 as shown in FIG. 8B through, for example, an evaporation process. An example of material for the adhesion promoter layer 44 includes chromium (Cr) and titanium (Ti) with a thickness of about 200–1,000 angstrom, for example. The adhesion promoter layer 44 is to facilitate the adhesion of conductive layer 46 of FIG. 8C on the silicon substrate 40. The conductive layer 46 is made, for example, of copper (Cu) or nickel (Ni), with a thickness of about 1,000–5,000 angstrom, for example. The conductive layer 46 is to establish electrical conductivity for an electroplating process in the later stage.

Figure 8D:
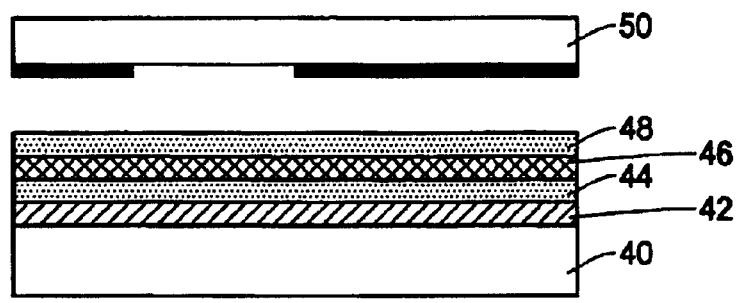
Figure 8E:
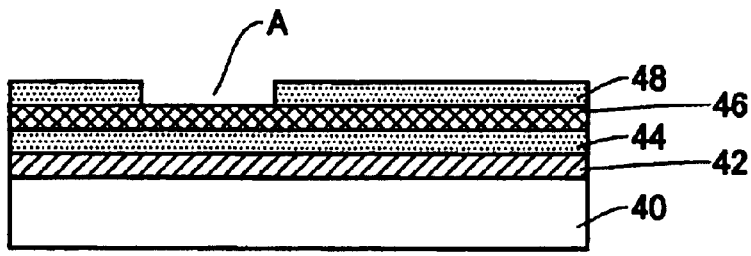
Figure 8F:
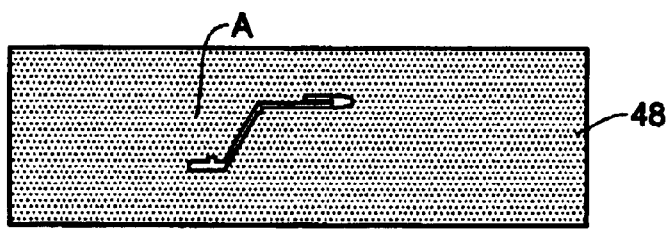

In the next process, a photoresist layer 48 is formed on the conductive layer 46 over which a photo mask 50 is precisely aligned to be exposed with ultraviolet (UV) light as shown in FIG. 8D. The photo mask 50 shows a two dimensional image of the contactor 30 which will be developed on the photoresist layer 48. As is well known in the art, positive as well as negative photoresist can be used for this purpose. If a positive acting resist is used, the photoresist covered by the opaque portions of the mask 50 hardens (cure) after the exposure. Examples of photoresist material include Novolak (M-Cresol-formaldehyde), PMMA (Poly Methyl Methacrylate), SU-8 and photo sensitive polyimide. In the development process, the exposed part of the resist can be dissolved and washed away, leaving a photoresist layer 48 of FIG. 8E having an opening or pattern "A". Thus, the top view of FIG. 8F shows the pattern or opening "A" on the photoresist layer 48 having the image (shape) of the contactor 30.

In the photolithography process in the foregoing, instead of the WV light, it is also possible to expose the photoresist layer 48 with an electron beam or X-rays as is known in the art. Further, it is also possible to directly write the image of the contact structure on the photoresist layer 48 by exposing the photoresist 48 with a direct write electron beam, X-ray or light source (laser).

Figure 8G:
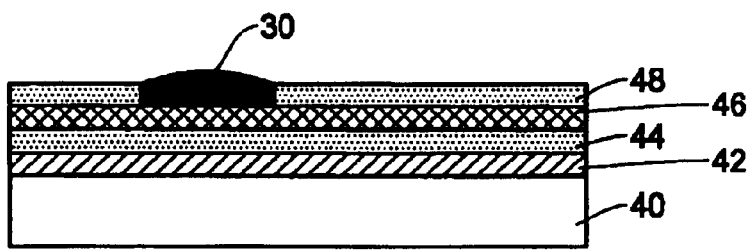
Figure 8H:
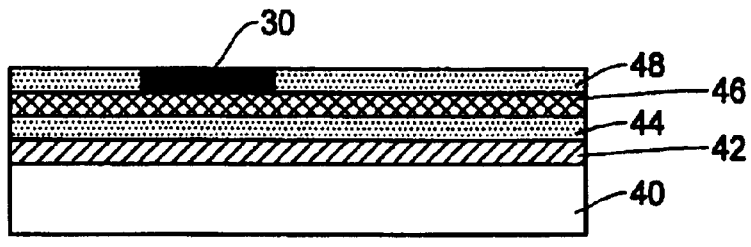

The conductive material such as copper (Cu), nickel (Ni), aluminum (Al), rhodium (Rh), palladium (Pd), tungsten (W) or other metal, nickel-cobalt (NiCo) or other alloy combinations thereof is deposited (electroplated) in the pattern "A" of the photoresist layer 48 to form the contactor 30 as shown in FIG. 8G. Preferably, a contact material which is different from that of the conductive layer 46 should be used to differentiate etching characteristics from one another as will be described later. The over plated portion of the contactor 30 in FIG. 8G is removed in the grinding (planarizing) process of FIG. 8H.

The above noted process may be repeated for producing contactors having different thickness by forming two or more conductive layers. For example, a certain portion of the contactor 30 may be designed to have a thickness larger than that of the other portions. In such a case, after forming a first layer of the contactors (conductive material), if necessary, the processes of FIGS. 8D–8H will be repeated to form a second layer or further layers on the first layer of the contactors.

Figure 8I:
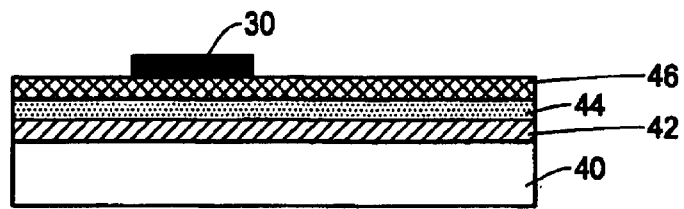
Figure 8J:
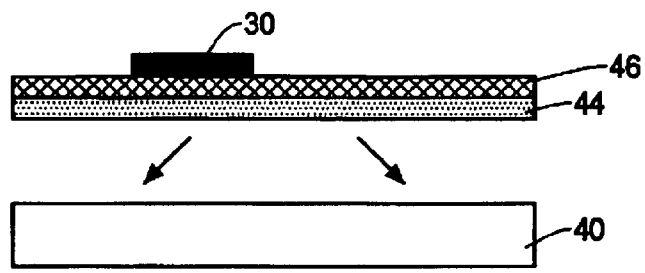
Figure 8K:
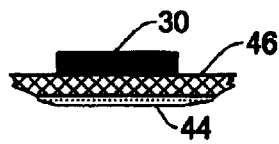
Figure 8L:

In the next process, the photoresist layer 48 is removed in a resist stripping process as shown in FIG. 8I. Typically, the photoresist layer 48 is removed by wet chemical processing. Other examples of stripping are acetone-based stripping and plasma $O_2$ stripping. In FIG. 8J, the sacrificial layer 42 is etched away so that the contactor 30 is separated from the silicon substrate 40. Another etching process is conducted so that the adhesion promoter layer 44 and the conductive layer 46 are removed from the contactor 30 as shown in FIG. 8K.

The etching condition can be selected to etch the layers 44 and 46 but not to etch the contactor 30. In other words, to etch the conductive layer 46 without etching the contactor 30, as noted above, the conductive material used for the contactor 30 must be different from the material of the conductive layer 46. Finally, the contactor 30 is separated from any other materials as shown in the perspective view of FIG. 8L. Although the production process in FIGS. 8A–8L shows only one contactor 30, in an actual production process, as shown in FIGS. 6A and 6B, a large number of contactors are produced at the same time.

FIGS. 9A–9D are schematic diagrams showing an example of production process for producing the contactors of the present invention. In this example, an adhesive tape 90 is incorporated in the production process to transfer the contactors 30 from the silicon substrate 40 to the adhesive tape. 90. FIGS. 9A–9D only show the latter part of the production process in which the adhesive tape 90 is involved.

Figure 9A:
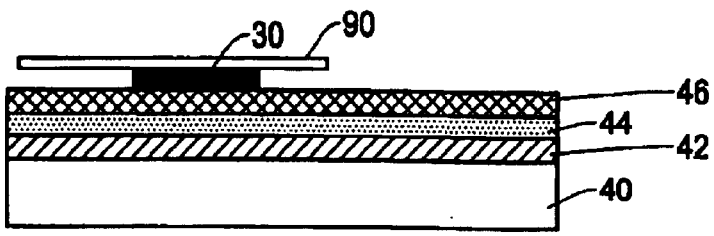
FIGS. 9A–9D are schematic diagrams showing another example of production process in the present invention for producing the contactors of the present invention.

FIG. 9A shows a process which is equivalent to the process shown in FIG. 8I where the photoresist layer 48 is removed in the resist stripping process. Then, also in the process of FIG. 9A, an adhesive tape 90 is placed on an upper surface of the contactor 30 so that the contactor 30 adheres to the adhesive tape 90. As noted above with reference to FIG. 6B, within the context of the present invention, the adhesive tape 90 includes other types of adhesive member, such as an adhesive film and adhesive plate, and the like. The adhesive tape 90 also includes any member which attracts the contactor 30 such as a magnetic plate or tape, an electrically charged plate or tape, and the like.

Figure 9B:
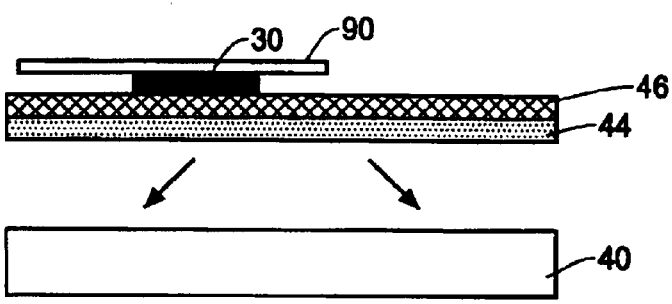
Figure 9C:
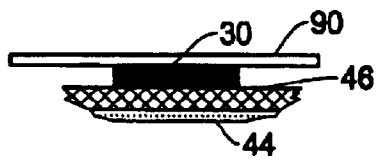
Figure 9D:
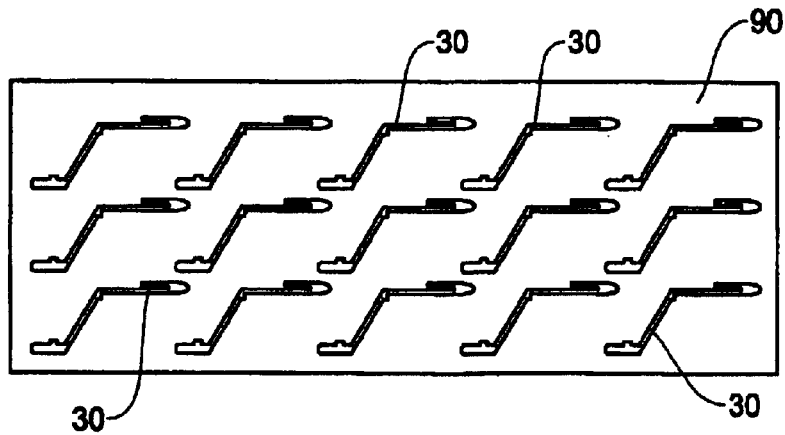

In the process shown in FIG. 9B, the sacrificial layer 42 is etched away so that the contactor 30 on the adhesive tape 90 is separated from the silicon substrate 40. Another etching process is conducted so that the adhesion promoter layer 44 and the conductive layer 46 are removed from the contactor 30 as shown in FIG. 9C.

As noted above, in order to etch the conductive layer 46 without etching the contactor 30, the conductive material used for the contactor 30 must be different from the material of the conductive layer. Although the production process in FIGS. 9A–9C shows only one contactor, in an actual production process, a large number of contactors are produced at the same time. Thus, a large number of contactors 30 are transferred to the adhesive tape 90 and separated from the silicon substrate and other materials as shown in the top view of FIG. 9D.

Figure 10A:
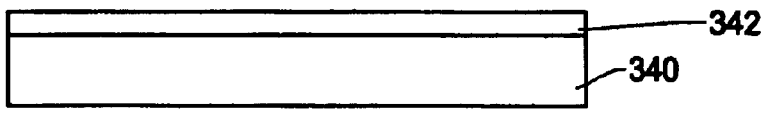
FIGS. 10A–10N are schematic diagrams showing an example of process for producing the contactors of the present invention on the surface of a substrate and transferring the contactors to an intermediate plate.
Figure 10B:
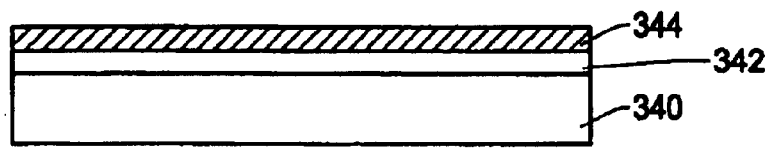
Figure 10C:
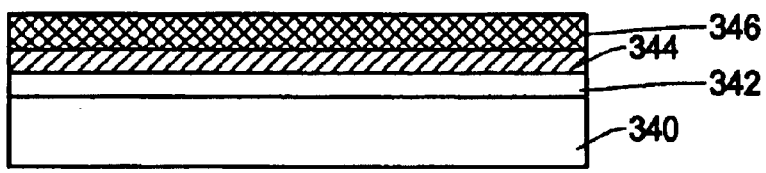
Figure 10D:
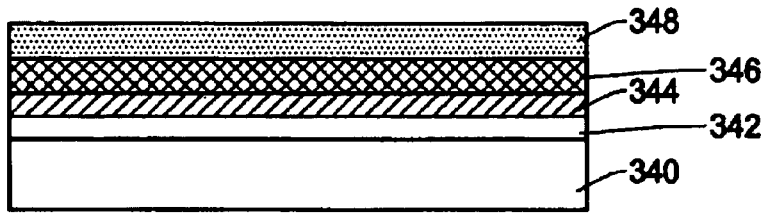
Figure 10E:
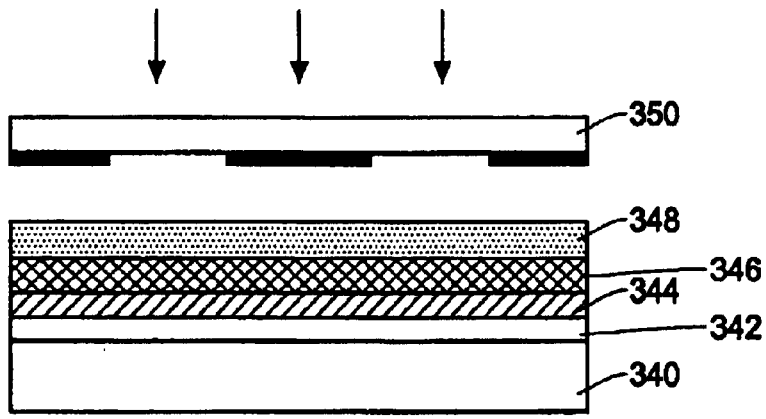
Figure 10F:
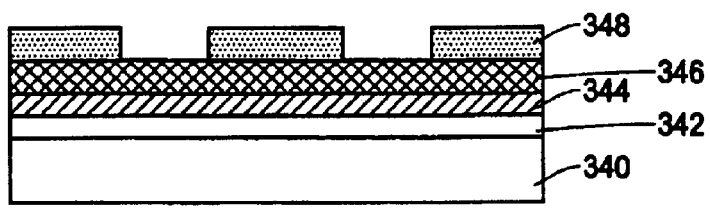
Figure 10G:
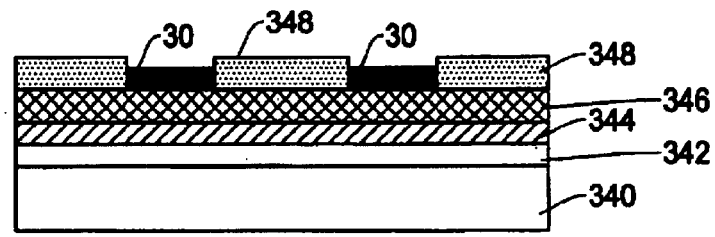
Figure 10H:
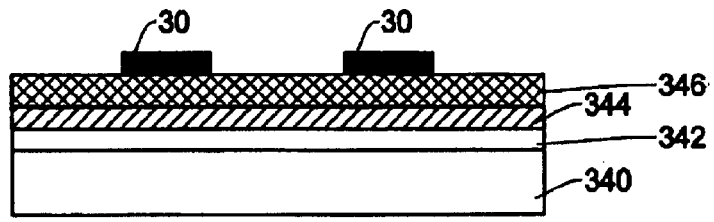
Figure 10I:
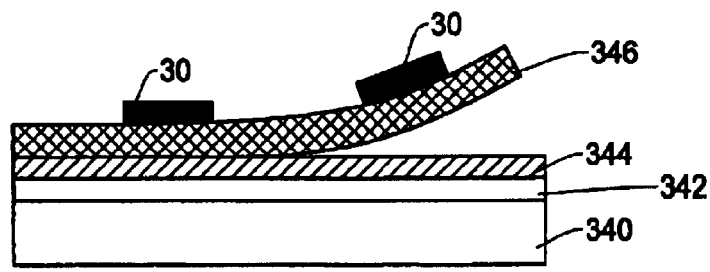
Figure 10J:
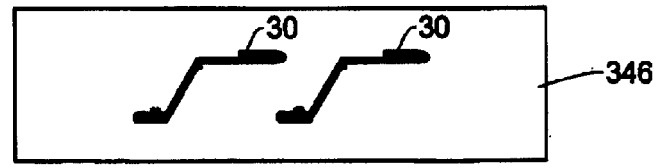
Figure 10K:
Figure 10L:
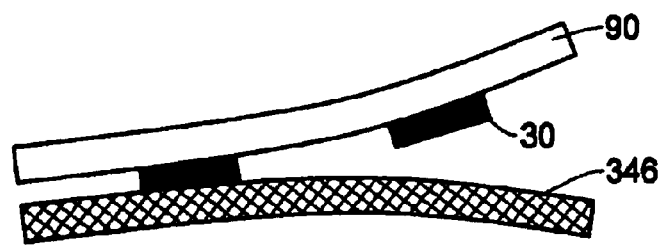
Figure 10M:
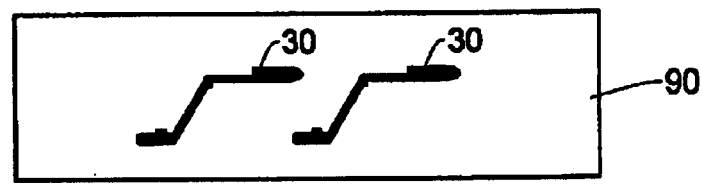
Figure 10N:

FIGS. 10A–10N are schematic diagrams showing a further example of production process for producing the contactor 30 where the contactors are transferred to the adhesive tape. In FIG. 10A, an electroplate seed (conductive) layer 342 is formed on a base substrate 340 which is typically a silicon or glass substrate. The seed layer 342 is made, for example, of copper (Cu) or nickel (Ni), with a thickness of about 1,000–5,000 angstrom, for example. A chrome-inconel layer 344 is formed on the seed layer 342 as shown in FIG. 10B through, for example, a sputtering process.

In the next process in FIG. 10C, a conductive substrate 346 is formed on the chrome-inconel layer 344. The conductive substrate 346 is made, for example, of nickel-cobalt (NiCo) with a thickness of about 100–130 μm. After passivating the conductive substrate 346, a photoresist layer 348 with a thickness of about 100–120 μm is formed on the conductive substrate 346 in FIG. 10D and a photo mask 350 is precisely aligned so that the photoresist layer 348 is exposed with ultraviolet (UV) light as shown in FIG. 10E. The photo mask 350 shows a two dimensional image of the contactor 30 which will be developed on the surface of the photoresist layer 348.

In the development process, the exposed part of the resist can be dissolved and washed away, leaving a photoresist layer 348 of FIG. 10F having a plating pattern transferred from the photo mask 350 having the image (shape) of the contactor 30. In the step of FIG. 10G, contactor material is electroplated in the plating pattern on the photoresist layer 348 with a thickness of about 50–60 μm. An example of the conductive material is nickel-cobalt (NiCo). The nickel-cobalt contactor material will not strongly adhere to the conductive substrate 346 made of nickel-cobalt.

In the case where the contactor has two or more different thickness, the above noted process may be repeated for producing the contactor by forming two or more conductive layers. Namely, after forming a first layer of the contactors, if necessary, the processes of FIGS. 10D–10G are repeated to form a second layer or further layers on the first layer of the contactors.

In the next process, the photoresist layer 348 is removed in a resist stripping process as shown in FIG. 10H. In FIG. 10I, the conductive substrate 346 is peeled from the chrome-inconel layer 344 on the substrate 340. The conductive substrate 346 is a thin substrate on which the contactors 30 are mounted with a relatively weak adhesive strength. The top view of the conductive substrate 346 having the contactors 30 is shown in FIG. 10J.

FIG. 10K shows a process in which an adhesive tape 90 is placed on an upper surface of the contactors 30. The adhesive strength between the adhesive tape 90 and the contactors 30 is greater than that between the contactors 30 and the conductive substrate 346. Thus, when the adhesive tape 90 is removed from the conductive substrate 346, the contactors 30 are transferred from the conductive substrate 346 to the adhesive tape 90 as shown in FIG. 10L. FIG. 10M shows a top view of the adhesive tape 90 having the contactors 30 thereon and FIG. 10N is a cross sectional view of the adhesive tape 90 having the contactors 30 thereon.

Figure 11A:
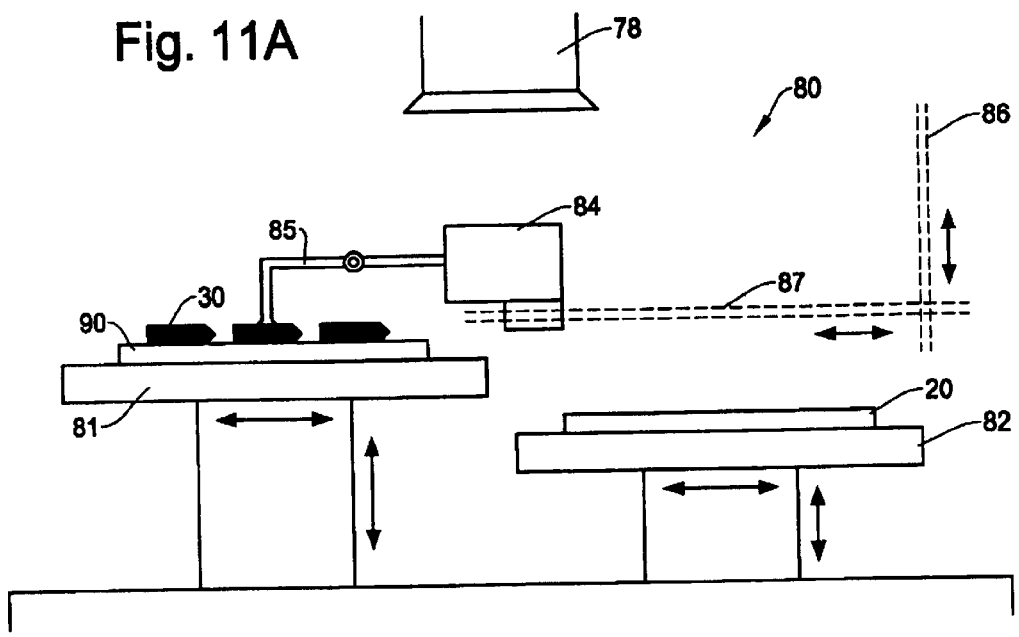
FIGS. 11A and 11B are schematic diagrams showing an example of pick and place mechanism and its process for picking the contactors and placing the same on a contactor carrier to produce the contact structure of the present invention.
Figure 11B:
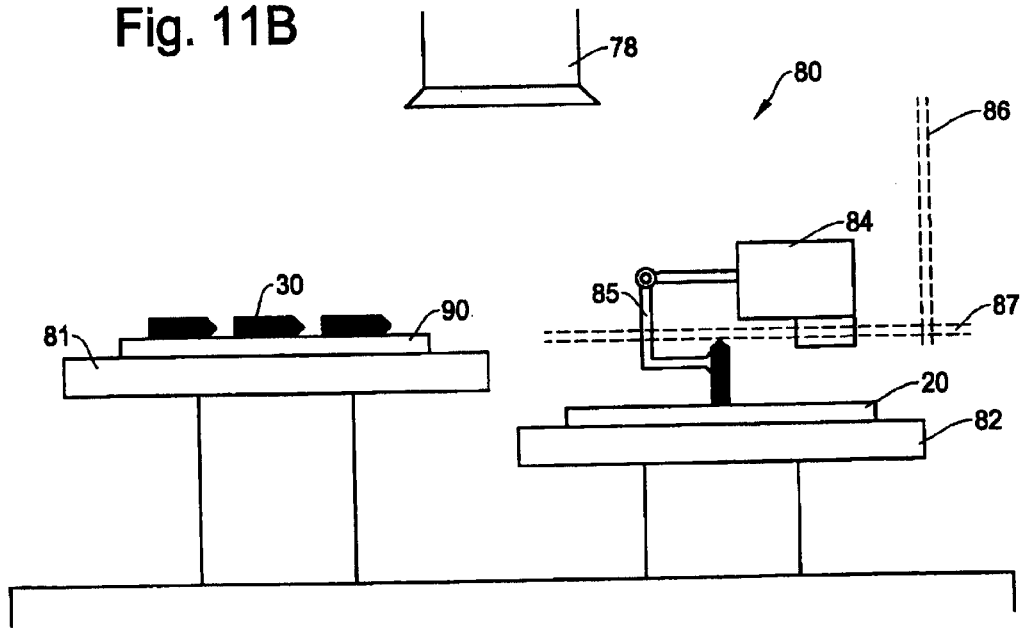

FIGS. 11A and 11B are schematic diagrams showing an example of process for picking the contactors 30 from the adhesive tape 90 and placing the contactors on the contactor carrier 20. The pick and place mechanism of FIGS. 11A and 11B is advantageously applied to the contactors produced by the production process of the present invention described with reference to FIGS. 9A–9D and FIGS. 10A–10N involving the adhesive tape. FIG. 11A is a front view of the pick and place mechanism 80 showing the first half process of the pick and place operation. FIG. 11B is a front view of the pick and place mechanism 80 showing the second half process of the pick and place operation.

In this example, the pick and place mechanism 80 is comprised of a transfer mechanism 84 to pick and place the contactors 30, mobile arms 86 and 87 to allow movements of the transfer mechanism 84 in X, Y and Z directions, tables 81 and 82 whose positions are adjustable in X, Y and Z directions, and a monitor camera 78 having, for example, a CCD image sensor therein. The transfer mechanism 84 includes a suction arm 85 that performs suction (pick operation) and suction release (place operation) operations for the contactors 30. The suction force is created, for example, by a negative pressure such as vacuum. The suction arm 85 rotates in a predetermined angle such as 90 degrees.

In operation, the adhesive tape 90 having the contactors 30 and the contactor carrier 20 having the bonding locations 32 (or through holes) are positioned on the respective tables 81 and 82 on the pick and place mechanism 80. As shown in FIG. 11A, the transfer mechanism 80 picks the contactor 30 from the adhesive tape 90 by suction force of the suction arm 85. After picking the contactor 30, the suction arm 85 rotates by 90 degrees, for example, as shown in FIG. 11B. Thus, the orientation of the contactor 30 is changed from the horizontal direction to the vertical direction. This orientation change mechanism is just an example, and a person skilled in the art knows that there are many other ways to change the orientation of the contactors. The transfer mechanism 80 then places the contactor 30 on the contactor carrier 20. The contactor 30 is attached to the contactor carrier 20 when inserted in the through holes.

Figure 2:
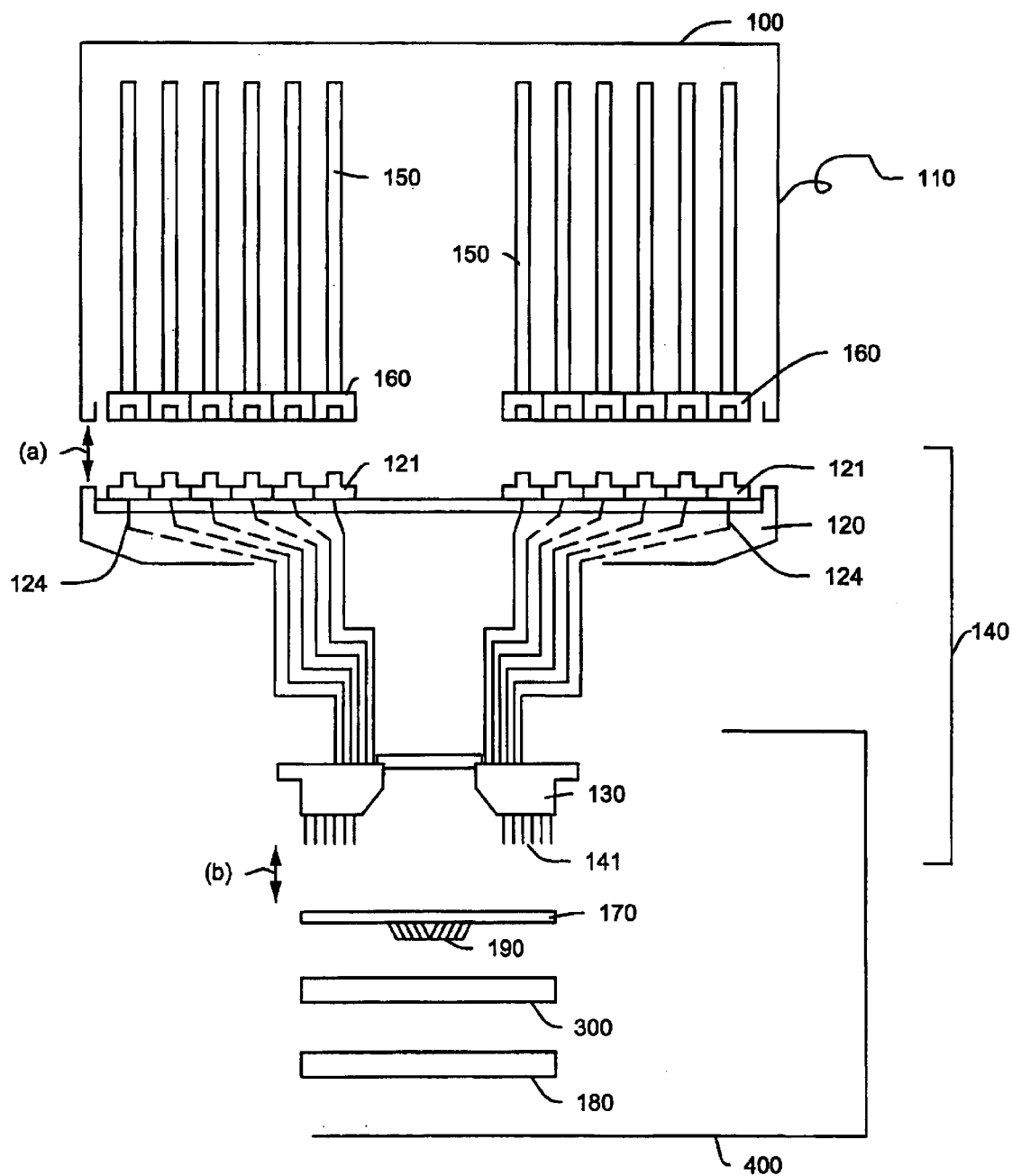
FIG. 2 is a diagram showing an example of more detailed structure for connecting the test head of the semiconductor test system to the substrate handler through an interface component.

FIG. 12 is a cross sectional view showing an example of total stack-up structure for forming a probe contact assembly using the contact structure of the present invention. The probe contact assembly is used as an interface between the device under test (DUT) and the test head of the semiconductor test system such as shown in FIG. 2. In this example, the probe contact assembly includes a routing board (probe card) 260, and a pogo-pin block (frog ring) 130 provided over the contact structure in the order shown in FIG. 12.

The contact structure is configured by a plurality of contactors 30 mounted on the contactor carrier 20. The upper end (base portion) 33 of each of the contactors 30 is projected at the upper surface of the contactor carrier 20. The lower end (contact portion) 35 is projected from the lower surface of the contactor carrier 20. In the present invention, the diagonal beam (spring) portion 32 between the upper end 33 and the intermediate portion has a cantilever shape which is inclined upwardly from the intermediate plate carrier 26. The contactors 30 may be slightly loosely inserted in the through holes on the contactor carrier 20 in a manner allowing small movements in the vertical and horizontal directions when pressed against the semiconductor wafer 300 and the probe card 260.

The probe card 260, pogo-pin block 130 and contact structure are mechanically as well as electronically connected with one another, thereby forming a probe contact assembly. Thus, electrical paths are created from the contact point of the contactors 30 to the test head 100 through the cables 124 and performance board 120 (FIG. 2). Thus, when the semiconductor wafer 300 and the probe contact assembly are pressed with each other, electrical communication will be established between the DUT (contact pads 320 on the wafer 300) and the test system.

The pogo-pin block (frog ring) 130 is equivalent to the one shown in FIG. 2 having a large number of pogo-pins to interface between the probe card 260 and the performance board 120. At upper ends of the pogo-pins, cables 124 such as coaxial cables are connected to transmit signals to printed circuit boards (pin electronics cards) 150 in the test head 100 in FIG. 2 through the performance board 120. The probe card 260 has a large number of electrodes 262 and 265 on the upper and lower surfaces thereof.

When assembled, the base portions 33 of the contactors 30 contact the electrodes 262. The electrodes 262 and 265 are connected through interconnect traces 263 to fan-out the pitch of the contact structure to meet the pitch of the pogo-pins in the pogo-pin block 130. Because the contactors 30 are loosely inserted in the through holes of the contactor carrier 20, the diagonal beam portions 32 of the contactors 30 deform easily and produce resilient contact forces toward the electrodes 262 and the contact pads 320 when pressed against the semiconductor wafer 300.

Figure 13:
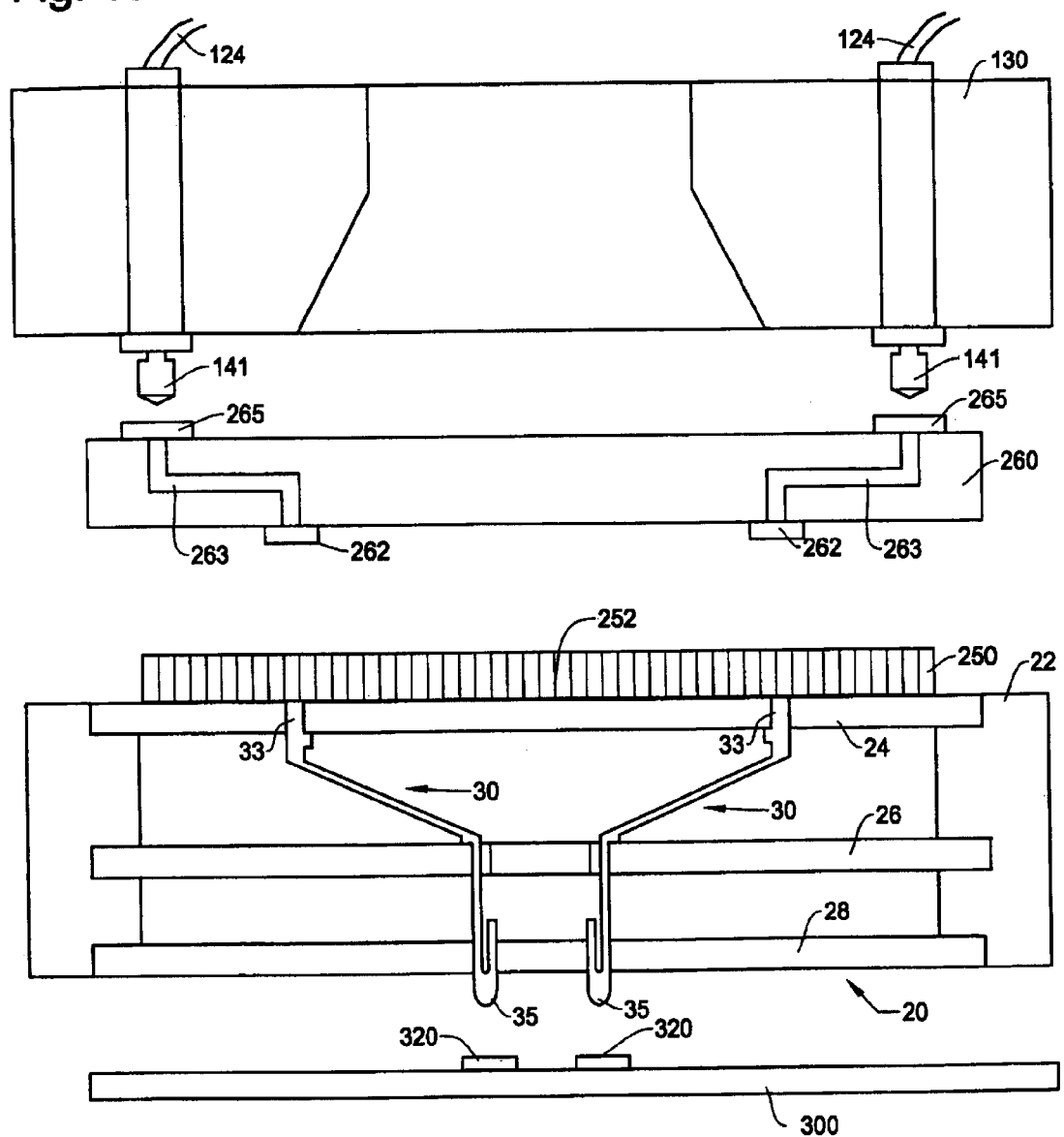
FIG. 13 is a cross sectional view showing another example of probe contact assembly using the contact structure of the present invention for use as an interface between the semiconductor device under test and a test head of the semiconductor test system.

FIG. 13 is a cross sectional view showing another example of probe contact assembly using the contact structure of the present invention. The probe contact assembly is used as an interface between the device under test (DUT) and the test head such as shown in FIG. 2. In this example, the probe contact assembly includes a conductive elastomer 250, a probe card 260, and a pogo-pin block (frog ring) 130 provided over the contact structure. Since the contactor 30 has the diagonal beam (spring) portion as mentioned above, such a conductive elastomer is usually unnecessary. However, the conductive elastomer may be still useful for compensating the unevenness of the gaps (planarity) between the probe card 260 and the contact structure.

The conductive elastomer 250 is provided between the contact structure and the probe card 260. When assembled, the upper ends 33 of the contactors 30 contact the conductive elastomer 250. The conductive elastomer 250 is an elastic sheet having a large number of conductive wires in a vertical direction. For example, the conductive elastomer 250 is comprised of a silicon rubber sheet and a multiple rows of metal filaments. The metal filaments (wires) are provided in the vertical direction of FIG. 13, i.e., orthogonal to the horizontal sheet of the conductive elastomer 250. An example of pitch between the metal filaments is 0.05 mm or less and thickness of the silicon rubber sheet is about 0.2 mm. Such a conductive elastomer is produced by Shin-Etsu Polymer Co. Ltd, Japan, and available in the market.

According to the present invention, the contact structure has a very high frequency bandwidth to meet the test requirements of next generation semiconductor technology. Since the large number of contactors are produced at the same time on the substrate without involving manual handling, it is possible to achieve consistent quality, high reliability and long life in the contact performance.

Further, because the contactors are assembled on the same substrate material as that of the device under test, it is possible to compensate positional errors caused by temperature changes. Further, it is possible to produce a large number of contactors in a horizontal direction on the silicon substrate by using relatively simple technique. The contact structure produced by the present invention is low cost and high efficiency and has high mechanical strength and reliability.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method for producing a contact structure, comprising the following steps of:
   (a) forming a sacrificial layer on a surface of a base substrate;
   (b) forming a photoresist layer on the sacrificial layer;
   (c) aligning a photo mask over the photoresist layer and exposing the photoresist layer through the photo mask, the photo mask including an image of contactors;
   (d) developing patterns of the image of the contactors on a surface of the photoresist layer;
   (e) forming the contactors made of conductive material in the patterns on the photoresist layer by depositing the conductive material; each of the contactors having an upper end, a straight beam portion with a lower end as a contact point, a return portion to create a predetermined gap with the straight beam portion, and a diagonal beam portion provided between the upper end and the straight beam portion to function as a spring;
   (f) stripping the photoresist layer off;
   (g) removing the sacrificial layer so that the contactors are separated from the silicon substrate; and
   (h) mounting the contactors on a contactor carrier having through holes to receive the contactors therein.

2. A method for producing a contact structure as defined in claim 1, after forming the contactors by depositing the conductive material, the method further comprising a step of placing an adhesive tape on the contactors so that upper surfaces of the contactors are attached to the adhesive tape.

3. A method for producing a contact structure as defined in claim 2, said step of mounting the contactors on the contactor carrier including a step of picking the contactor from the adhesive tape and changing orientation of the contactor and placing the contactor on the contactor carrier with use of a pick and place mechanism which utilizes a suction force to attract the contactor.

4. A method for producing a contact structure, comprising the following steps of:
   (a) forming an conductive substrate made of electric conductive material on a base substrate;
   (b) forming a photoresist layer on the conductive substrate;
   (c) aligning a photo mask over the photoresist layer and exposing the photoresist layer through the photo mask, the photo mask including an image of contactors;
   (d) developing patterns of the image of the contactors on a surface of the photoresist layer;
   (e) forming the contactors made of conductive material in the patterns on the photoresist layer by depositing the conductive material, wherein each of the contactors having an upper end, a straight beam portion with a lower end as a contact point, a return portion to create a predetermined gap with the straight beam portion, and a diagonal beam portion provided between the upper end and the straight beam portion to function as a spring;
   (f) stripping off the photoresist layer;
   (g) peeling the conductive substrate having contactors thereon from the dielectric substrate;
   (h) placing an adhesive tape on the contactors on the conductive substrate so that upper surfaces of the contactors adhere to the adhesive tape wherein adhesive strength between the contactors and the adhesive tape is larger than that between the contactors and the conductive substrate;
   (i) peeling the conductive substrate so that the contactors on the adhesive tape are separated from the conductive substrate; and
   (j) mounting the contactor on a contactor carrier having a through hole.

5. A method for producing a contact structure as defined in claim 1, wherein said step of exposing the photoresist layer includes a step of exposing the photoresist layer by ultraviolet light, laser light, an electron beam, or X-rays.

6. A method for producing a contact structure as defined in claim 1, wherein said steps of exposing the photoresist layer and developing the patterns include a step of applying an electron beam, X-ray, or laser light to form the patterns of the image of the contactors on the photoresist layer.

7. A method for producing a contact structure as defined in claim 1, further including a step of forming a seed layer made of electric conductive material on the sacrificial layer for depositing the conductive material through an electroplating process, and a step of forming an adhesion promoter layer between the sacrificial layer and the conductive layer.

8. A method for producing a contact structure as defined in claim 7, wherein the electric conductive material for the seed layer is different from the electric conductive material for the contactors.

9. A method for producing a contact structure as defined in claim 4, said step of mounting the contactors on the contactor carrier including a step of picking the contactor from the adhesive tape and changing orientation of the contactor and placing the contactor on the contactor carrier with use of a pick and place mechanism which utilizes a suction force to attract the contactor.

10. A method for producing a contact structure as defined in claim 4, wherein said step of exposing the photoresist layer includes a step of exposing the photoresist layer by ultraviolet light, laser light, an electron beam, or X-rays.

11. A method for producing a contact structure as defined in claim 4, wherein said steps of exposing the photoresist layer and developing the patterns include a step of applying an electron beam, X-ray, or laser light to form the patterns of the image of the contactors on the photoresist layer.

12. A method for producing a contact structure as defined in claim 4, further including a step of forming a seed layer made of electric conductive material on the sacrificial layer for depositing the conductive material through an electroplating process, and a step of forming an adhesion promoter layer between the sacrificial layer and the conductive layer.

13. A method for producing a contact structure as defined in claim 12, wherein the electric conductive material for the seed layer is different from the electric conductive material for the contactors.

14. A method for producing a contact structure as defined in claim 4, wherein the conductive substrate and the contactors are made of nickel-cobalt (NiCo).

15. A method for producing a contact structure as defined in claim 4, further comprising a step of forming a chrome-inconel layer on the dielectric substrate where the conductive substrate is created on the chrome-inconel layer.

* * * * *